(12) United States Patent
Zhang et al.

(10) Patent No.: US 9,960,196 B2
(45) Date of Patent: May 1, 2018

(54) ARRAY SUBSTRATE, DISPLAY PANEL, DISPLAY DEVICE AND MASK PLATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Zhang, Beijing (CN); Jiapeng Li, Beijing (CN); Jing Zhang, Beijing (CN); Lei Chen, Beijing (CN); Dongjiang Sun, Beijing (CN)

(73) Assignees: BOE TECHNOLOGY GROUP CO., LTD. (CN); BEIJING BOE OPTOELECTRONICS TECHNOLOGY CO., LTD. (CN)

( * ) Notice: Subject to any disclaimer, the term of this patent is extended or adjusted under 35 U.S.C. 154(b) by 0 days. days.

(21) Appl. No.: 15/647,518

(22) Filed: Jul. 12, 2017

(65) Prior Publication Data
US 2018/0026057 A1 Jan. 25, 2018

(30) Foreign Application Priority Data
Jul. 22, 2016 (CN) .......................... 2016 1 0587218

(51) Int. Cl.
*H01L 21/00* (2006.01)
*H01L 27/142* (2014.01)
*H01L 27/12* (2006.01)

(52) U.S. Cl.
CPC ........ *H01L 27/142* (2013.01); *H01L 27/1288* (2013.01)

(58) Field of Classification Search
CPC .......................... H01L 27/142; H01L 27/1288
See application file for complete search history.

(56) References Cited

U.S. PATENT DOCUMENTS

| | | | |
|---|---|---|---|
| 5,670,388 A * | 9/1997 | Machesney et al. | ... H01L 27/1203 148/DIG. 150 |
| 6,356,331 B1 * | 3/2002 | Ono | ... G02F 1/134363 349/110 |
| 2015/0360253 A1 * | 12/2015 | Liu | ... H01L 51/0011 427/282 |

\* cited by examiner

*Primary Examiner* — Richard Booth
(74) *Attorney, Agent, or Firm* — Brooks Kushman P.C.

(57) ABSTRACT

An array substrate includes a gate line, a common electrode line, a common electrode and a pixel electrode arranged on a base substrate. The common electrode is electrically connected to the common electrode line through a common electrode via-hole, and the common electrode includes a hollowed-out portion and a reserved portion at a region corresponding to the common electrode via-hole. The reserved portion is arranged between the gate line adjacent to the common electrode line and the pixel electrode adjacent to the common electrode line, and electrically connected to the common electrode line through the common electrode via-hole. The reserved portion does not overlap the gate line or the pixel electrode. The hollowed-out portion is at least arranged at a side of the reserved portion adjacent to the gate line and/or pixel electrode and between the reserved portion and the gate line and/or the pixel electrode.

18 Claims, 6 Drawing Sheets

ARRAY SUBSTRATE, DISPLAY PANEL, DISPLAY DEVICE AND MASK PLATE

CROSS-REFERENCE TO RELATED APPLICATION

The present application claims priority to Chinese Patent Application No. 201610587218.0 filed on Jul. 22, 2016, which is incorporated herein by reference in its entirety.

TECHNICAL FIELD

The present disclosure relates to the field of display technology, in particular to an array substrate, a display panel, a display device and a mask plate.

BACKGROUND

Along with the development of the liquid crystal display technology, a thin film transistor liquid crystal display (TFT-LCD) has been widely applied to various fields.

A conventional TFT-LCD includes an array substrate, a liquid crystal layer and an opposite substrate. Usually, a common electrode is arranged on the array substrate and connected to a common electrode line through a common electrode via-hole. During the actual manufacture of the array substrate, in the case that the common electrode via-holes are too small, a part of the common electrode via-holes may not penetrate through corresponding layers due to limitations of manufacture devices and processes, and at this time, the common electrodes are incapable of being electrically connected to the corresponding common electrode lines through these common electrode via-holes. Hence, the common electrode via-holes must be formed in accordance with their specifications. However, due to such objective factors such as product design and production line environment and such uncontrollable factors as equipment management and human factors, the common electrode via-hole may be too large or offset from an appropriate position. In this regard, short-circuit may occur between the common electrode and a gate line or a pixel electrode, and a capacitive coupling defect may probably occur between the common electrode and the gate line.

SUMMARY

An object of the present disclosure is to provide an array substrate, a display panel, a display device and a mask plate, so as to prevent the occurrence of short-circuit between the common electrode and the gate line or the pixel electrode, and meanwhile prevent the occurrence of the capacitive coupling defect between the common electrode and the gate line.

In one aspect, the present disclosure provides in some embodiments an array substrate, including a gate line, a common electrode line, a common electrode and a pixel electrode arranged on a base substrate. The common electrode is electrically connected to the common electrode line through a common electrode via-hole, and the common electrode includes a hollowed-out portion and a reserved portion at a region corresponding to the common electrode via-hole. The reserved portion is arranged between the gate line adjacent to the common electrode line and the pixel electrode adjacent to the common electrode line, and electrically connected to the common electrode line through the common electrode via-hole. The reserved portion does not overlap the gate line or the pixel electrode. The hollowed-out portion is at least arranged at a side of the reserved portion adjacent to the gate line and between the reserved portion and the gate line, and/or the hollowed-out portion is at least arranged at a side of the reserved portion adjacent to the pixel electrode and between the reserved portion and the pixel electrode.

In a possible embodiment of the present disclosure, the hollowed-out portion is of a U-like shape or a N-like shape, and the reserved portion is surrounded by the hollowed-out portion.

In a possible embodiment of the present disclosure, in a direction perpendicular to the common electrode line, the reserved portion has a width greater than a width of the common electrode via-hole and smaller than a distance between the gate line and the pixel electrode.

In a possible embodiment of the present disclosure, in the direction perpendicular to the common electrode line, a portion of the gate line having a width of 1 to 4 µm is exposed by the hollowed-out portion.

In a possible embodiment of the present disclosure, in the direction perpendicular to the common electrode line, a portion of the pixel electrode having a width of 1 to 3 µm is exposed by the hollowed-out portion.

In a possible embodiment of the present disclosure, the common electrode is arranged at a side of the pixel electrode away from the base substrate.

In a possible embodiment of the present disclosure, the common electrode line is arranged between the gate line and the pixel electrode.

In a possible embodiment of the present disclosure, the common electrode line is arranged parallel to and at a layer identical to the gate line.

In a possible embodiment of the present disclosure, the pixel electrode is arranged between the base substrate and the common electrode, a passivation layer is arranged between the pixel electrode and the common electrode, a gate insulation layer is arranged between the base substrate and the pixel electrode, and the common electrode via-hole penetrates through the gate insulation layer and the passivation layer.

In a possible embodiment of the present disclosure, the array substrate further includes a TFT, and the pixel electrode is in direct contact with a drain electrode of the TFT.

In a possible embodiment of the present disclosure, the common electrode is arranged between the pixel electrode and the base substrate, the common electrode via-hole penetrates through all insulation layers between the common electrode and the common electrode line, and the pixel electrode is electrically connected to the drain electrode of the TFT through a via-hole in an insulation layer between the pixel electrode and the drain electrode of the TFT.

In a possible embodiment of the present disclosure, the region of the common electrode corresponding to the common electrode via-hole has an area larger than that of the common electrode via-hole.

In a possible embodiment of the present disclosure, the reserved portion is formed integrally with the portion of the common electrode other than the region corresponding to the common electrode via-hole.

In another aspect, the present disclosure provides in some embodiments a display panel including the above-mentioned array substrate.

In a possible embodiment of the present disclosure, the display panel further includes an opposite substrate, and the opposite substrate includes a black matrix and a color filter.

In yet another aspect, the present disclosure provides in some embodiments a display device including the above-mentioned display panel.

In still yet another aspect, the present disclosure provides in some embodiments a mask plate for manufacturing a common electrode, including a mask plate body which includes a pattern region corresponding to a common electrode via-hole. The pattern region includes an opening portion and a body portion. The body portion is configured to form a reserved portion of the common electrode, the reserved portion is electrically connected to a common electrode line through the common electrode via-hole, and the opening portion is configured to form a hollowed-out portion.

In a possible embodiment of the present disclosure, the opening portion is of a U-like or N-like shape, and the body portion is surrounded by the opening portion.

According to the mask plate, the array substrate, the display panel and the display device in the embodiments of the present disclosure, the region of the common electrode corresponding to the common electrode via-hole includes the hollowed-out portion and the reserved portion, and the reserved portion is located between the gate line adjacent to the common electrode line and the pixel electrode adjacent to the common electrode line, so as to enable the reserved portion to be electrically connected to the common electrode line through the common electrode via-hole. Based on this, the hollowed-out portion is at least located at a side of the reserved portion adjacent to the gate line and/or located at a side of the reserved portion adjacent to the pixel electrode, and the reserved portion does not overlap the gate line or the pixel electrode. Hence, during the manufacture of the array substrate, even in the case that the common electrode via-hole is too large and is offset toward the gate line or the pixel electrode, no common electrode is located above an overlapping portion between the common electrode via-hole and the gate line or the pixel electrode due to the existence of the hollowed-out portion, so as to prevent the occurrence of short-circuit between the common electrode and the gate line or the pixel electrode. In addition, as compared with the related art where a capacitive coupling defect may occur between the common electrode and the gate line in the case that a gate insulation layer is etched and thinned, in the embodiments of the present disclosure, even in the case that the gate insulation layer is etched and thinned due to the large common electrode via-hole and the position deviation thereof, it is still able to prevent the occurrence of the capacitive coupling defect due to the hollowed-out portion.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

FIG. 1(*b*) is a sectional view of the array substrate along line AA in FIG. 1(*a*);

FIG. 2(*b*) is a sectional view of the array substrate along line BB in FIG. 2(*a*);

FIG. 3(*b*) is a sectional view of the array substrate along line CC in FIG. 3(*a*);

FIG. 6(*b*) is a sectional view of the array substrate along line DD in FIG. 6(*a*)

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1A:
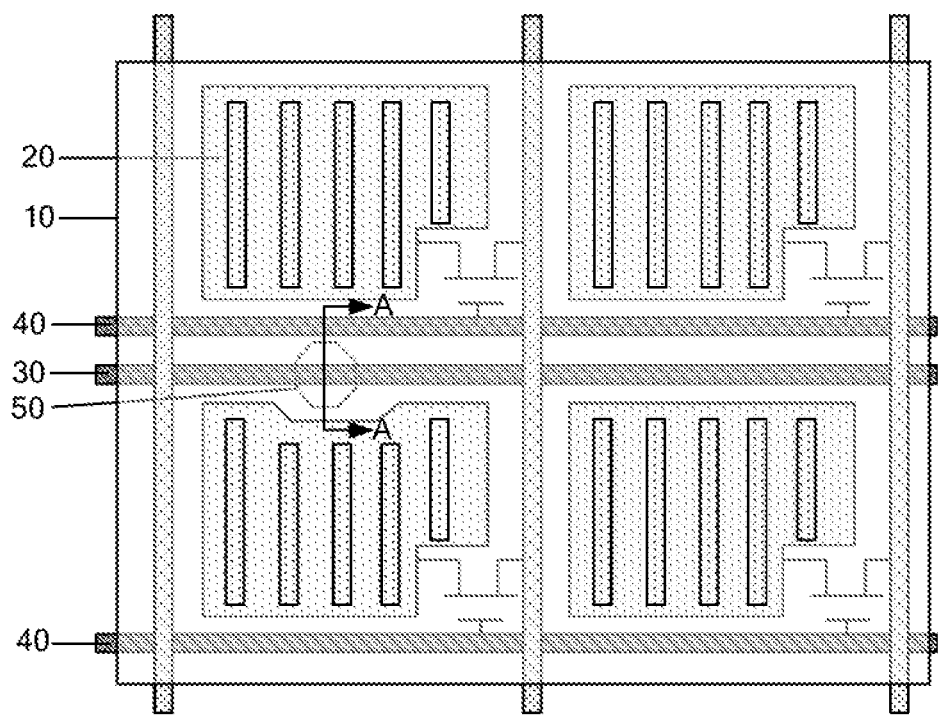
FIG. 1(*a*) is a schematic view showing an array substrate in a related art.
Figure 1B:
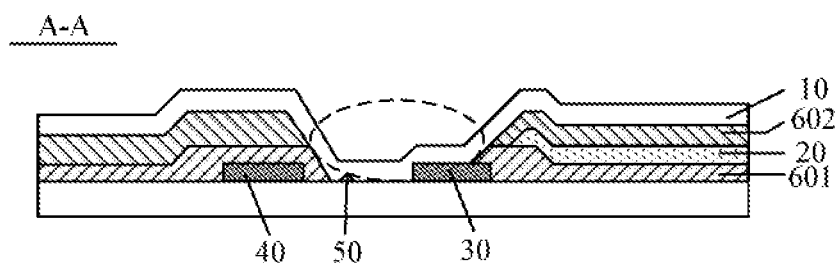

A TFT-LCD includes an array substrate, a liquid crystal layer and an opposite substrate. As shown in FIGS. 1(*a*) and 1(*b*), a common electrode 10 is arranged on the array substrate, and a common electrode via-hole 50 is formed by etching a gate insulation layer 601 and a passivation layer 602. The common electrode 10 is electrically connected to a common electrode line 30 through the common electrode via-hole 50.

Figure 2A:
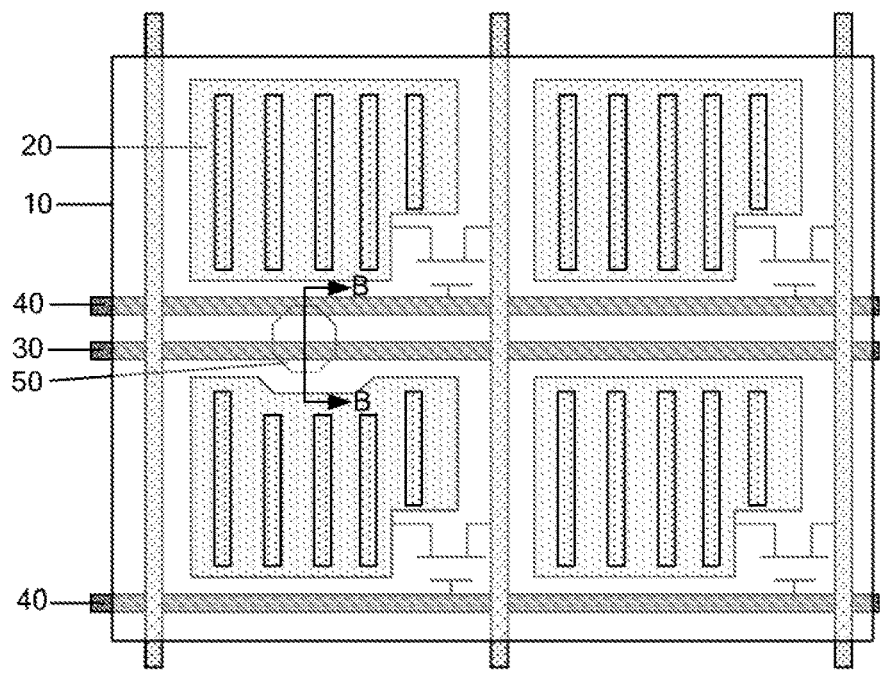
FIG. 2(*a*) is another schematic view showing an array substrate in a related art.
Figure 2B:
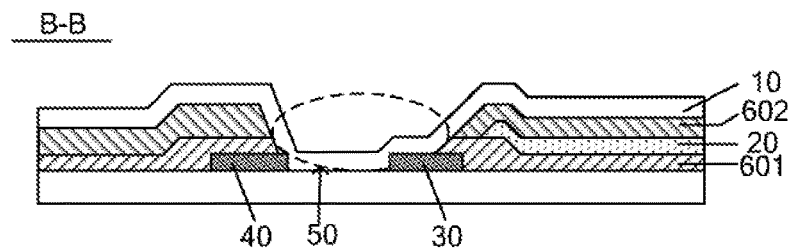
Figure 3A:
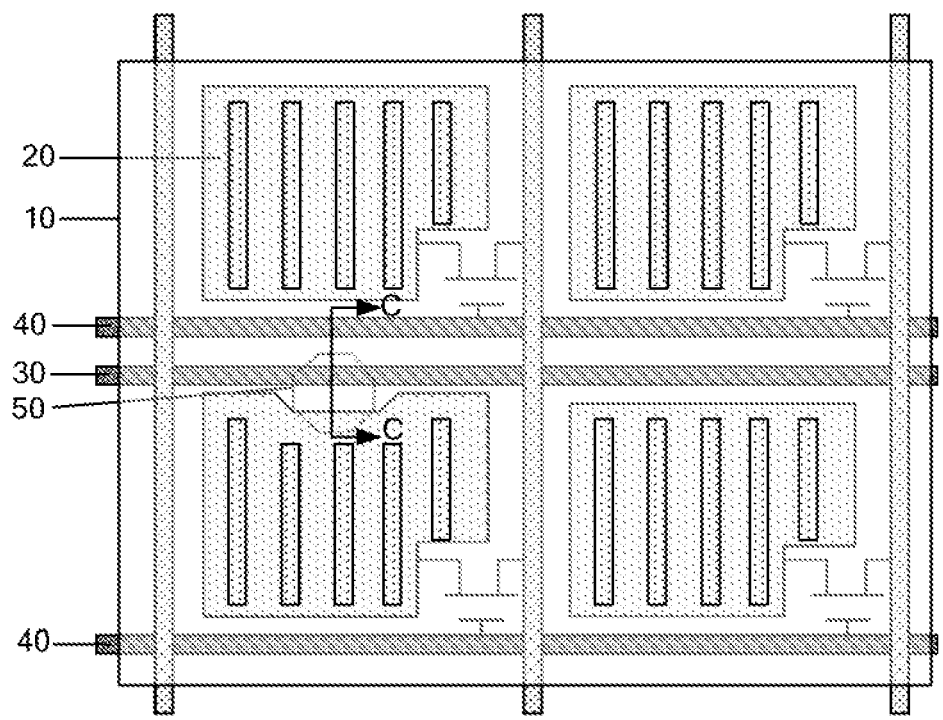
FIG. 3(*a*) is yet another schematic view showing an array substrate in a related art.
Figure 3B:
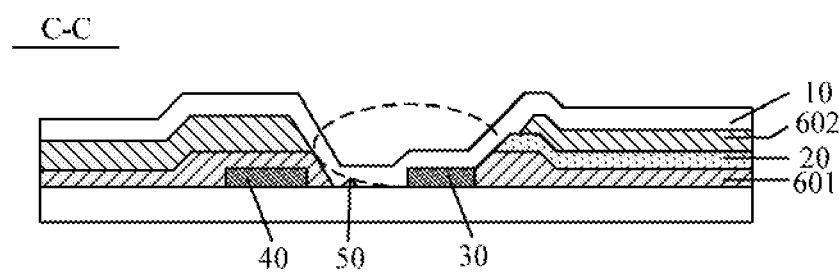

As shown in FIGS. 2(*a*) and 2(*b*), if the common electrode via-hole 50 is too large or its position is offset, a portion of the gate insulation layer 601 at the common electrode via-hole 50 and above a gate line 40 may be etched off, and the gate line 40 may be exposed, resulting in short-circuit between the common electrode 10 and the gate line 40. Even in the case that the gate insulation layer 601 at the common electrode via-hole 50 and above the gate line 40 is not etched off completely, it may be thinned, resulting in a capacitive coupling defect between the common electrode 10 and the gate line 40. As shown in FIGS. 3(*a*) and 3(*b*), if the common electrode via-hole 50 is too large or its position is offset, a pixel electrode 20 may be exposed and connected to the common electrode via-hole 50, resulting in short-circuit between the common electrode 10 and the pixel electrode 20.

Figure 4:
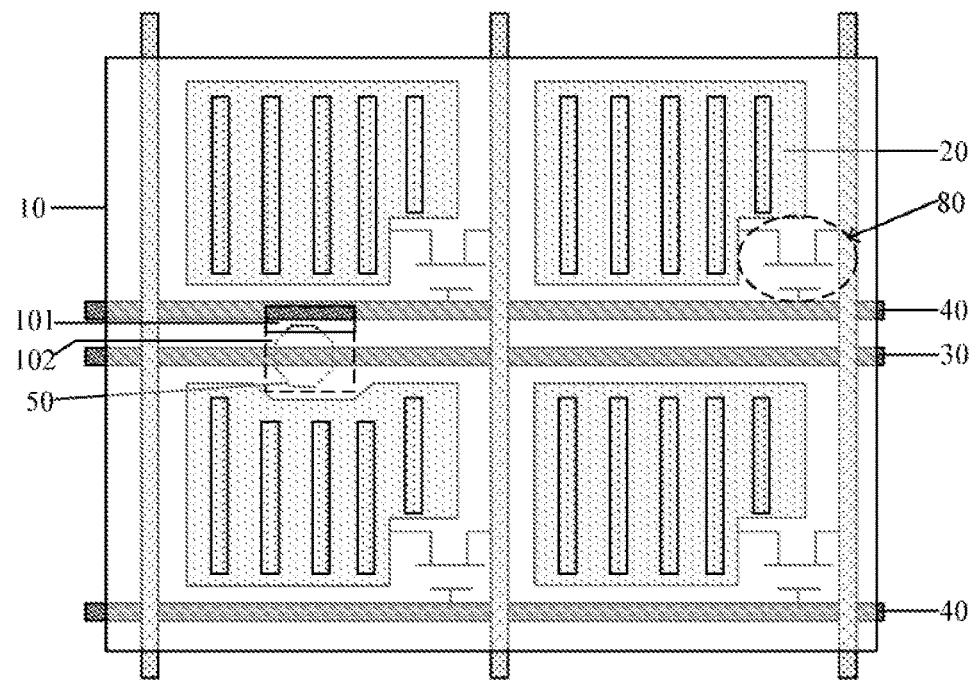
FIG. 4 is a schematic view showing an array substrate according to at least one embodiment of the present disclosure.
Figure 5:
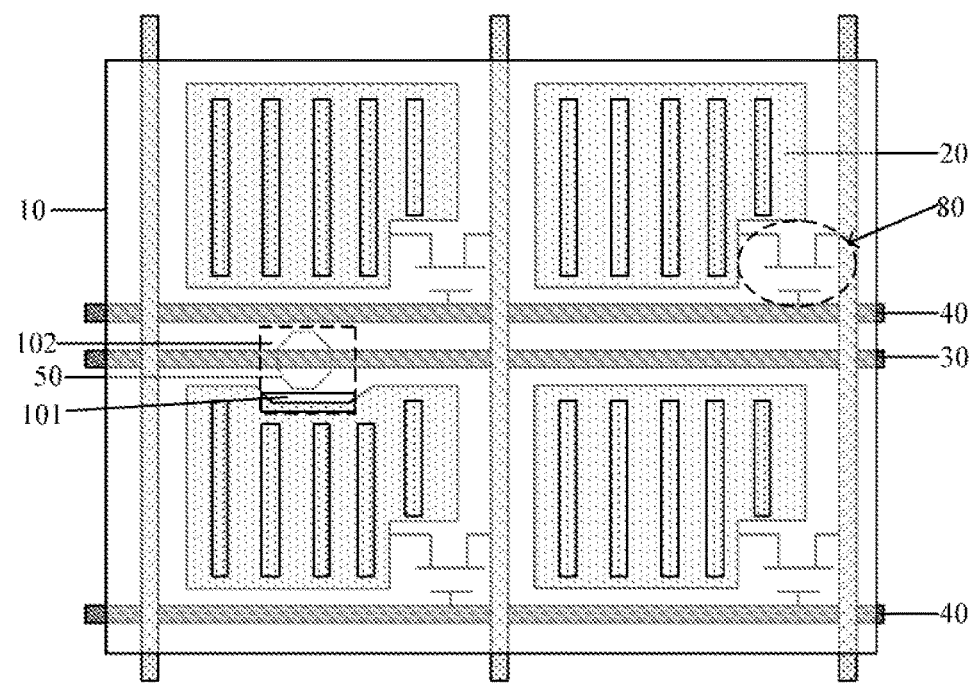
FIG. 5 is another schematic view showing the array substrate according to at least one embodiment of the present disclosure.

The present disclosure provides in some embodiments an array substrate which, as shown in FIGS. 4, 5, 6(*a*) and 6(*b*), includes a gate line 40, a common electrode line 30, a common electrode 10 and a pixel electrode 20 arranged on a base substrate 70. The common electrode 10 is electrically connected to the common electrode line 30 through a common electrode via-hole 50. The common electrode 10 includes a hollowed-out portion 101 and a reserved portion 102 at a region corresponding to the common electrode via-hole 50 (i.e., a region indicated by a dotted box in the drawings). The reserved portion 102 is arranged between the gate line 40 adjacent to the common electrode line 30 and the pixel electrode 20 adjacent to the common electrode line 30, and electrically connected to the common electrode line 30 through the common electrode via-hole 50. The reserved portion 102 does not overlap the gate line 40 or the pixel electrode 20. The hollowed-out portion 101 is at least arranged at a side of the reserved portion 102 adjacent to the gate line 40 and between the reserved portion 102 and the gate line 40, and/or the hollowed-out portion 101 is at least arranged at a side of the reserved portion 102 adjacent to the pixel electrode 20 and between the reserved portion 102 and the pixel electrode 20.

It should be appreciated that, firstly, the common electrode line 30 is arranged between the gate line 40 and the pixel electrode 20. In order to reduce the number of patterning processes, in a possible embodiment of the present disclosure, the common electrode line 30 may be arranged parallel to and at a layer identical to the gate line 40 (i.e., the common electrode line 30 and the gate line 40 may be formed by a single patterning process).

Secondly, a position of the common electrode 10 relative to the pixel electrode 20 may not be defined herein. In FIGS. 4, 5, 6(*a*) and 6(*b*), the pixel electrode 20 is arranged between the base substrate 70 and the common electrode 10.

When the pixel electrode 20 is arranged between the base substrate 70 and the common electrode 10, for a bottom-gate TFT 80, as shown in FIG. 6(*b*), the common electrode via-hole 50 may penetrate through a gate insulation layer 601 and a passivation layer 602. The passivation layer 602 is arranged between the pixel electrode 20 and the common electrode 10. The pixel electrode 20 may be in direct contact with a drain electrode of the TFT 80, rather than through a via-hole.

Of course, the array substrate is not limited to the situation as shown in FIG. 6(*b*), and the common electrode via-hole 50 may also penetrate through all insulation layers between the common electrode 10 and the common electrode line 30 depending on a structure of the TFT 80.

In addition, the common electrode 10 may also be arranged between the pixel electrode 20 and the base substrate 70. At this time, the common electrode via-hole 50 needs to penetrate through all the insulation layers between the common electrode 10 and the common electrode line 30, and the pixel electrode 20 needs to be electrically connected to the drain electrode of the TFT through a via-hole in an insulation layer between the pixel electrode 20 and the drain electrode of the TFT.

Thirdly, the region of the common electrode 10 corresponding to the common electrode via-hole 50 has an area larger than that of the common electrode via-hole.

A size of the other portion of the common electrode 10 other than the region corresponding to the common electrode via-hole 50 will not be particularly defined, as long as the region of the common electrode 10 corresponding to the common electrode via-hole 50 is arranged as mentioned above.

Fourthly, a size of the reserved portion 102 will not be particularly defined herein. The reserved portion 102 may completely or partially cover the common electrode via-hole 50, as long as the reserved portion 102 is electrically connected to the common electrode line 30 through the common electrode via-hole 50 and does not overlap the gate line 40 or the pixel electrode 20. The reserved portion 102 is formed integrally with the portion of the common electrode 10 other than the region corresponding to the common electrode via-hole 50.

Fifthly, as shown in FIG. 4, the hollowed-out portion 101 may be merely arranged at a side of the reserved portion 102 adjacent to the gate line 40 and between the reserved portion 102 and the gate line 40. The hollowed-out portion 101 may overlap the gate line 40, i.e., a portion of the gate line 40 may be exposed by the hollowed-out portion 101.

In a possible embodiment of the present disclosure, as shown in FIG. 5, the hollowed-out portion 101 may be merely arranged at a side of the reserved portion 102 adjacent to the pixel electrode 20 and between the reserved portion 102 and the pixel electrode 20. The hollowed-out portion 101 may overlap the pixel electrode 20, i.e., a portion of the pixel electrode 20 may be exposed by the hollowed-out portion 101.

In a possible embodiment of the present disclosure, as shown in FIG. 6(*a*), the hollowed-out portion 101 is arranged at both a side of the reserved portion 102 adjacent to the gate line 40 and a side of the reserved portion 102 adjacent to the pixel electrode 20.

Sixthly, a size of the hollowed-out portion 101 will not be particularly defined herein. When the hollowed-out portion is arranged at a side of the reserved portion 102 adjacent to the gate line 40, its size may be set in such a manner as to prevent the occurrence of short-circuit between the common electrode 10 and the gate line 40 in the case that the common electrode via-hole 50 is too large or its position is offset toward the gate line 40. In the case that the hollowed-out portion 101 is arranged at a side of the reserved portion 102 adjacent to the pixel electrode 20, its size may be set in such a manner as to prevent the occurrence of short-circuit between the common electrode 10 and the pixel electrode 20 in the case that the common electrode via-hole 50 is too large or its position is offset toward the pixel electrode 20.

Of course, considering the uniformity of the common electrode 10, the size of the hollowed-out portion 101 shall not be too big, so as to prevent a display effect from being adversely affected.

According to the array substrate in the embodiments of the present disclosure, the region of the common electrode 10 corresponding to the common electrode via-hole 50 includes the hollowed-out portion 101 and the reserved portion 102, and the reserved portion 102 is located between the gate line 40 adjacent to the common electrode line 30 and the pixel electrode 20 adjacent to the common electrode line 30, so as to enable the reserved portion 102 to be electrically connected to the common electrode line 30 through the common electrode via-hole 59. Based on this, the hollowed-out portion 101 is at least located at a side of the reserved portion 102 adjacent to the gate line 40 and/or located at a side of the reserved portion 102 adjacent to the pixel electrode 20, and the reserved portion 102 does not overlap the gate line 40 or the pixel electrode 20. Hence, during the manufacture of the array substrate, even in the case that the common electrode via-hole 50 is too large and is offset toward the gate line 40 or the pixel electrode 20, no common electrode is located above an overlapping portion between the common electrode via-hole 50 and the gate line 40 or the pixel electrode 20 due to the existence of the hollowed-out portion 101, so as to prevent the occurrence of short-circuit between the common electrode 10 and the gate line 40 or the pixel electrode 20. In addition, as compared with the related art where a capacitive coupling defect may occur between the common electrode 10 and the gate line 40 in the case that the gate insulation layer 601' is etched and thinned, in the embodiments of the present disclosure, even in the case that the gate insulation layer 601 is etched and thinned due to the large common electrode via-hole 50 and the position deviation thereof, it is still able to prevent the occurrence of the capacitive coupling defect due to the hollowed-out portion 101.

Figure 6A:
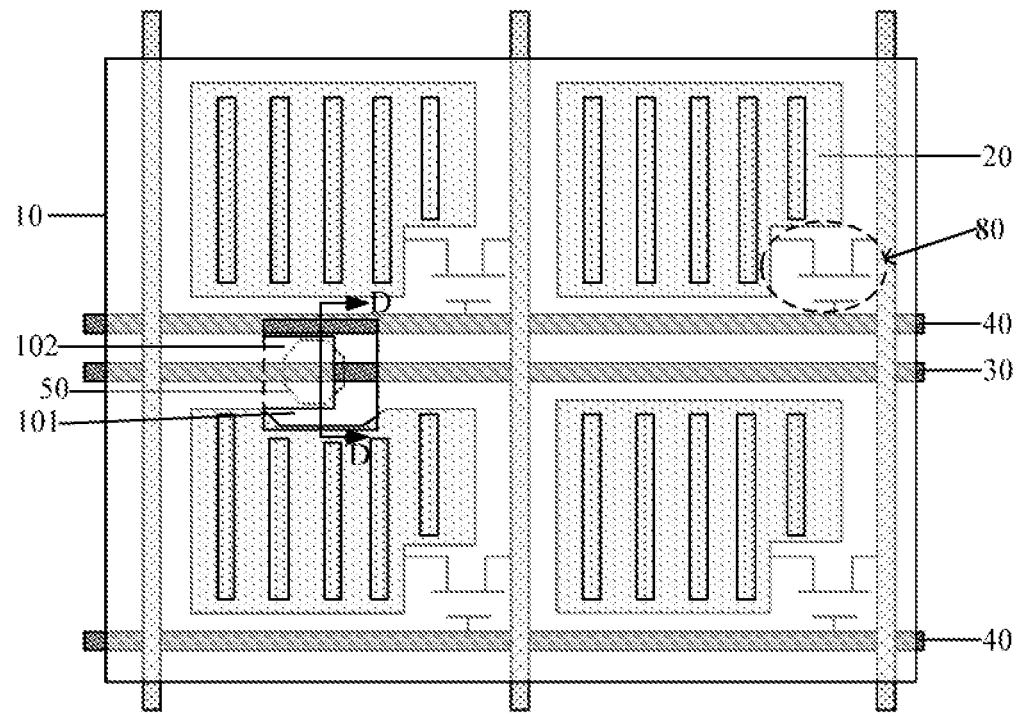
FIG. 6(*a*) is yet another schematic view showing the array substrate according to at least one embodiment of the present disclosure.
Figure 6B:
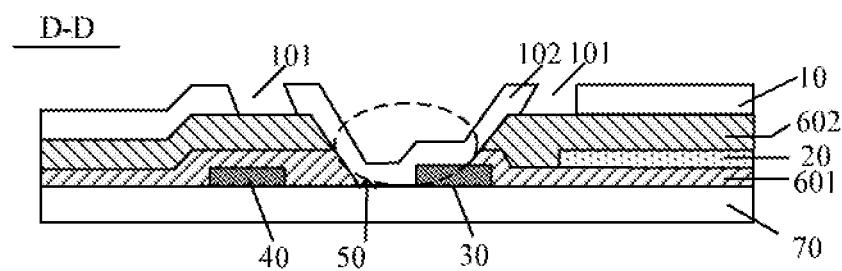

In a possible embodiment of the present disclosure, as shown in FIG. 6(a), the hollowed-out portion 101 is at least arranged at a side of the reserved portion 102 adjacent to the gate line 40 and at a side of the reserved portion 102 adjacent to the pixel electrode 20.

Based on the above, the hollowed-out portion 101 may be of a U-like shape or an N-like shape, i.e., parts of the hollowed-out portion 101 at both sides of the reserved portion 102 may be connected to each other. The reserved portion 102 may be surrounded on two or three sides by the hollowed-out portion 101. In this way, when the common electrode via-hole 50 is offset in any direction, it is still able to prevent the occurrence of short-circuit between the common electrode 10 and the gate line 40 or the pixel electrode 20.

In a possible embodiment of the present disclosure, in a direction perpendicular to the common electrode line 30, the reserved portion 102 has a width greater than a width of the common electrode via-hole 50 and smaller than a distance between the gate line 40 and the pixel electrode 20.

Here, the width of the common electrode via-hole 50 is just its design specification, i.e., a width of the common electrode via-hole 50 in the direction perpendicular to the common electrode line 30 when the common electrode via-hole 50 is not too large and its position is not offset during the manufacture. In this way, it is able to ensure the reserved portion 102 to be in full contact with the common electrode line 30 through the common electrode via-hole 50, thereby to enable the common electrode 10 to be electrically connected to the common electrode line 30.

In a possible embodiment of the present disclosure, in the direction perpendicular to the common electrode line 30 (i.e., in a direction where a data line extends), a portion of the gate line 40 having a width of 1 to 4 µm is exposed by the hollowed-out portion 101.

A distance between the common electrode via-hole 50 and the gate line 40 may be at least 2 µm, and a width fluctuation of the common electrode via-hole 50 is usually about 1 µm, i.e., even in the case of no offset, the distance between the common electrode via-hole 50 and the gate line 40 may be reduced to about 1 µm. Usually, the common electrode via-hole 50 may be offset by 0.75 to 1 µm, and meanwhile the common electrode 10 may also be offset. In addition, the larger the display device is, the larger the width fluctuation of the common electrode via-hole 50 and an offset amount of each of the common electrode via-hole 50 and the common electrode 10 are. At this time, if the portion of the gate line 40 having a width of 1 to 4 µm is exposed by the hollowed-out portion 101, it is able to prevent the occurrence of short-circuit between the common electrode 10 and the gate line 40.

In addition, when the portion of the gate line 40 having a width of 1 to 4 µm is exposed by the hollowed-out portion 101 at the region of the common electrode 10 corresponding to the common electrode via-hole 50, a display effect may not be adversely affected.

In a possible embodiment of the present disclosure, in the direction perpendicular to the common electrode line 30 (i.e., the direction where the data line extends), a portion of the pixel electrode 20 having a width of 1 to 3 µm is exposed by the hollowed-out portion 101.

A distance between the common electrode via-hole 50 and the pixel electrode 20 may be 2 to 3 µm or more, and the width fluctuation of one side of the common electrode via-hole 50 is usually about 1 µm, i.e., even in the case of no offset, the distance between the common electrode via-hole 50 and the pixel electrode 20 may be reduced to about 1 to 2 µm. Usually, the common electrode via-hole 50 may be offset by 0.75 to 1 µm, and meanwhile the common electrode 10 may also be offset. In addition, the larger the display device is, the larger the width fluctuation of the common electrode via-hole 50 and an offset amount of each of the common electrode via-hole 50 and the common electrode 10 are. At this time, if the portion of the pixel electrode 20 having a width of 1 to 3 µm is exposed by the hollowed-out portion 101, it is able to prevent the occurrence of short-circuit between the common electrode 10 and the pixel electrode 20.

In addition, when the portion of the pixel electrode 20 having a width of 1 to 3 µm is exposed by the hollowed-out portion 101 at the region of the common electrode 10 corresponding to the common electrode via-hole 50, a display effect may not be adversely affected.

In a possible embodiment of the present disclosure, as shown in FIGS. 4, 5, 6(a) and 6(b), the common electrode 10 is arranged at a side of the pixel electrode 20 away from the base substrate 70. In this way, the pixel electrode 20 may be in direct contact with the drain electrode of the TFT 80, and insulated from the common electrode 10 merely through the passivation layer 602, so as to simplify the manufacture process.

The present disclosure further provides in a display panel including the above-mentioned array substrate. Of course, the display panel may further include an opposite substrate and a liquid crystal layer arranged between the array substrate and the opposite substrate. The opposite substrate may include a black matrix and a color filter.

According to the display panel in the embodiments of the present disclosure, the region of the common electrode 10 corresponding to the common electrode via-hole 50 includes the hollowed-out portion 101 and the reserved portion 102, and the reserved portion 102 is located between the gate line 40 adjacent to the common electrode line 30 and the pixel electrode 20 adjacent to the common electrode line 30, so as to enable the reserved portion 102 to be electrically connected to the common electrode line 30 through the common electrode via-hole 59. Based on this, the hollowed-out portion 101 is at least located at a side of the reserved portion 102 adjacent to the gate line 40 and/or located at a side of the reserved portion 102 adjacent to the pixel electrode 20, and the reserved portion 102 does not overlap the gate line 40 or the pixel electrode 20. Hence, during the manufacture of the array substrate, even when the common electrode via-hole 50 is too large and is offset toward the gate line 40 or the pixel electrode 20, no common electrode is located above an overlapping portion between the common electrode via-hole 50 and the gate line 40 or the pixel electrode 20 due to the existence of the hollowed-out portion 101, so as to prevent the occurrence of short-circuit between the common electrode 10 and the gate line 40 or the pixel electrode 20. In addition, as compared with the related art where a capacitive coupling defect may occur between the common electrode 10 and the gate line 40 when the gate insulation layer 601 is etched and thinned, in the embodiments of the present disclosure, even if that the gate insulation layer 601 is etched and thinned due to the large common electrode via-hole 50 and the position offset thereof, it is still able to prevent the occurrence of the capacitive coupling defect due to the hollowed-out portion 101.

The present disclosure further provides in some embodiments a display device including the above-mentioned display panel. The display device may be any product or member having display and touch functions, such as a liquid crystal display, a liquid crystal television, a digital photo frame, a mobile phone or a flat-panel computer.

The present disclosure further provides in some embodiments a mask plate for manufacturing the above-mentioned common electrode 10.

Figure 7:
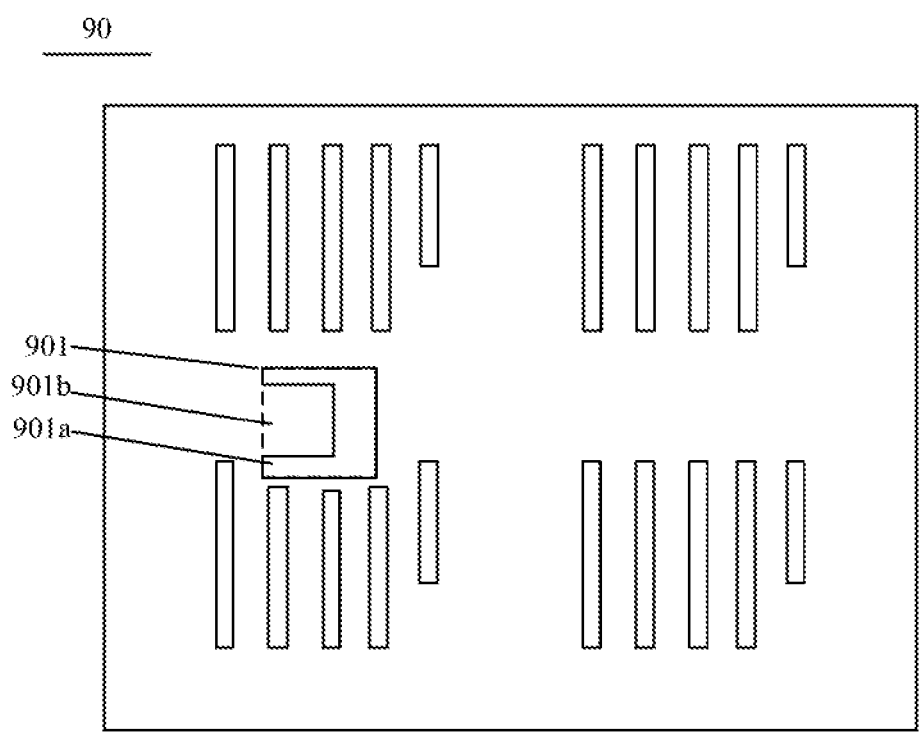
FIG. 7 is a schematic view showing a mask plate according to at least one embodiment of the present disclosure.

As shown in FIG. 7, the mask plate 90 includes a mask plate body which includes a pattern region 901 corresponding to the common electrode via-hole 50. The pattern region 901 includes an opening portion 901a and a body portion 901b. The body portion 901b is configured to form the reserved portion 102 of the common electrode 10, the reserved portion 102 is electrically connected to the common electrode line 30 through the common electrode via-hole 50, and the opening portion 901a is configured to form the hollowed-out portion 101.

For example, the common electrode 10 may be manufactured as follows. A transparent conductive film (e.g., an indium tin oxide (ITO) film) may be formed on the base substrate, and then a photoresist may be applied onto the ITO film. Next, the mask plate 90 may be placed above the photoresist, so as to expose and develop the photoresist and remove a portion of the ITO film corresponding to the opening portion 901a. Then, the portion of the ITO film not covered by the photoresist may be etched off through a wet-etching process, so as to form the hollowed-out portion 101. The portion of the ITO film not etched off and corresponding to the pattern region 901 forms the reserved portion 102.

It should be appreciated that, the other portion of the mask plate body other than the pattern region 901 may be set in accordance with the structure of the common electrode 10, and thus will not be particularly defined herein.

In a possible embodiment of the present disclosure, as shown in FIG. 7, the opening portion 901a is of a U-like or N-like shape, and the body portion 901b is surrounded by the opening portion 901a. In this way, when the common electrode via-hole 50 is offset in any directions, it is still able to prevent the occurrence of short-circuit between the common electrode 10 and the gate line 40 or the pixel electrode 20.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a gate line, a common electrode line, a common electrode and a pixel electrode arranged on a base substrate, wherein the common electrode is electrically connected to the common electrode line through a common electrode via-hole;
   the common electrode comprises a hollowed-out portion and a reserved portion at a region corresponding to the common electrode via-hole;
   the reserved portion is arranged between the gate line adjacent to the common electrode line and the pixel electrode adjacent to the common electrode line, and electrically connected to the common electrode line through the common electrode via-hole;
   the reserved portion does not overlap the gate line or the pixel electrode; and
   the hollowed-out portion is at least arranged at a side of the reserved portion adjacent to the gate line and between the reserved portion and the gate line, and/or the hollowed-out portion is at least arranged at a side of the reserved portion adjacent to the pixel electrode and between the reserved portion and the pixel electrode.

2. The array substrate according to claim 1, wherein the hollowed-out portion is of a U-like shape or a N-like shape, and the reserved portion is surrounded by the hollowed-out portion.

3. The array substrate according to claim 1, wherein in a direction perpendicular to the common electrode line, the reserved portion has a width greater than a width of the common electrode via-hole and smaller than a distance between the gate line and the pixel electrode.

4. The array substrate according to claim 3, wherein in the direction perpendicular to the common electrode line, a portion of the gate line having a width of 1 to 4 μm is exposed by the hollowed-out portion.

5. The array substrate according to claim 3, wherein in the direction perpendicular to the common electrode line, a portion of the pixel electrode having a width of 1 to 3 μm is exposed by the hollowed-out portion.

6. The array substrate according to claim 1, wherein the common electrode is arranged at a side of the pixel electrode away from the base substrate.

7. The array substrate according to claim 1, wherein the common electrode line is arranged between the gate line and the pixel electrode.

8. The array substrate according to claim 1, wherein the common electrode line is arranged parallel to and at a layer identical to the gate line.

9. The array substrate according to claim 1, wherein the pixel electrode is arranged between the base substrate and the common electrode, a passivation layer is arranged between the pixel electrode and the common electrode, a gate insulation layer is arranged between the base substrate and the pixel electrode, and the common electrode via-hole penetrates through the gate insulation layer and the passivation layer.

10. The array substrate according to claim 6, further comprising a thin film transistor (TFT), wherein the pixel electrode is in direct contact with a drain electrode of the TFT.

11. The array substrate according to claim 10, wherein the common electrode is arranged between the pixel electrode and the base substrate, the common electrode via-hole penetrates through all insulation layers between the common electrode and the common electrode line, and the pixel electrode is electrically connected to a drain electrode of the TFT through a via-hole in an insulation layer between the pixel electrode and the drain electrode of the TFT.

12. The array substrate according to claim 1, wherein the region of the common electrode corresponding to the common electrode via-hole has an area larger than that of the common electrode via-hole.

13. The array substrate according to claim 1, wherein the reserved portion is formed integrally with the portion of the common electrode other than the region corresponding to the common electrode via-hole.

14. A display panel, comprising the array substrate according to claim 1.

15. The display panel according to claim 14, further comprising an opposite substrate, wherein the opposite substrate comprises a black matrix and a color filter.

16. A display device, comprising the display panel according to claim 14.

17. A mask plate for manufacturing a common electrode, comprising a mask plate body, wherein the mask plate body comprises a pattern region corresponding to a common electrode via-hole;

the pattern region comprises an opening portion and a body portion; and the body portion is configured to form a reserved portion of the common electrode, the reserved portion is electrically connected to a common electrode line through the common electrode via-hole, and the opening portion is configured to form a hollowed-out portion.

18. The mask plate according to claim 17, wherein the opening portion is of a U-like or N-like shape, and the body portion is surrounded by the opening portion.

\* \* \* \* \*